United States Patent
Lin

(10) Patent No.: US 7,323,776 B2
(45) Date of Patent: Jan. 29, 2008

(54) ELEVATED HEAT DISSIPATING DEVICE

(75) Inventor: Pei-His Lin, Sijhih (TW)

(73) Assignee: Thermaltake Technology Co., Ltd. (TW)

( * ) Notice: Subject to any disclaimer, the term of this patent is extended or adjusted under 35 U.S.C. 154(b) by 147 days.

(21) Appl. No.: 11/292,564

(22) Filed: Dec. 2, 2005

(65) Prior Publication Data

US 2006/0118948 A1 Jun. 8, 2006

(30) Foreign Application Priority Data

Dec. 3, 2004 (TW) .............................. 93219464 U

(51) Int. Cl.
*H05K 7/20* (2006.01)
*H01L 23/34* (2006.01)

(52) U.S. Cl. .............................. 257/712; 257/E23.088; 257/E23.099; 257/721; 257/722; 257/713; 257/717; 257/720; 257/690; 257/694; 257/695; 257/697

(58) Field of Classification Search ........ 257/E23.088, 257/E23.099, 712, 721, 713, 717, 720, 722; 361/689, 699, 690, 694, 695, 697; 62/3.61, 62/239
See application file for complete search history.

(56) References Cited

U.S. PATENT DOCUMENTS 6,502,405 B1 * 1/2003 Van Winkle ................. 62/3.61

| 7,021,368 | B2 * | 4/2006 | Lin et al. ................ 165/104.33 |
| 7,032,389 | B2 * | 4/2006 | Cauchy ......................... 62/3.3 |
| 7,059,391 | B2 * | 6/2006 | Whitney ................ 165/104.33 |
| 2005/0098304 | A1 * | 5/2005 | Lin et al. ................ 165/104.33 |
| 2005/0207115 | A1 * | 9/2005 | Barsun et al. .............. 361/690 |
| 2006/0096741 | A1 * | 5/2006 | Hegde ................... 165/104.33 |
| 2006/0146499 | A1 * | 7/2006 | Reents ........................ 361/704 |

* cited by examiner

*Primary Examiner*—Alexander Oscar Williams
(74) *Attorney, Agent, or Firm*—Schmeiser, Olsen & Watts

(57) ABSTRACT

The elevated heat dissipating device of the present invention comprises a thermal substrate connecting onto a heat source and at least one heat conductive pipe connecting to the thermal substrate. The heat conductive pipe further comprises a connecting part connected to a top portion of the thermal substrate, and a bending part which is bended and extended upward away from the thermal substrate. A plurality of sets of heat fins connecting to end portions of the bending part of the heat conductive pipe are supported and elevated by the heat conductive pipe so that an air space is formed between the thermal substrate and the sets of heat fins. A fan locating on a top part of the heat fins, wherein a plurality of air passages are formed in between those heat fins so that cool air ventilates from the fan through the air passages of the heat fins to the thermal substrate.

2 Claims, 4 Drawing Sheets

ELEVATED HEAT DISSIPATING DEVICE

FIELD OF INVENTION

The present invention relates generally to an elevated heat dissipating device. More particularly, the present invention relates to a heat device with a plurality of sets of heat fins that are elevated and supported by at least one heat conductive pipe so that an air space is formed in between the sets of heat fins and a thermal substrate. Cool air can ventilate easily through the sets of heat fins and the thermal substrate in order to dissipate the hot air to the outer environment immediately.

DESCRIPTION OF THE RELATED ART

The current common heat dissipating device utilized in the central processor of the computer is shown in FIG. 1. The heat dissipating device of FIG. 1, comprises a thermal substrate 71, a plurality of heat conductive pipes 72, a plurality of sets of the heat fins 73 and a fan 74. Ends of the heat conductive pipes 72 are connected tightly onto the thermal substrate 71. Another end of the heat conductive pipes 72 is directly bended and extended upward along one side of the thermal substrate 71 so that the ends of the heat conductive pipes 72 are parallel to the thermal substrate 71, as shown in FIG. 1, and are also connected to the sets of heat fins 73. The fan 74 is located above the sets of heat fins 73. The set of heat fins 73 are comprised of a plurality of heat fins stacked together next to each other so that the plurality of sets of heat fins are formed. Bottom parts 731 of the heat fins projected on the thermal substrate 71 are located on a top portion of the thermal substrate 71, wherein a heat source 75 is connected to the thermal substrate 71 and the heat energy generated from the heat source 75 is transmitted along the heat conductive pipes 72 and those heat fins that come in contact with the thermal substrate 71. The heat is then transmitted from the bottom parts 731 of the heat fins to the whole sets of heat fins 73 so that the heat can be dissipated away from the device to the outer environment.

The sets of the heat fins 73 are assembled with a plurality of stacked heat fins. The high density in the number of heat fins and the way the heat fins have been stacked together cause a very narrow air gap to form in between the heat fins. As a result, cool air can not flow easily through the narrow air gaps between heat fins. The fan is the main source to ventilate the cool air into the heat fins in order to ventilate the hot air away from the device. However, the bottom parts 731 of the sets of heat fins 73 are assembled in plurality of numbers along the top portion of the thermal substrate 71 in such that the external cool air cannot flow through a central portion of the sets of the heat fins 73. Furthermore, although the cool air is induced by the fan 74 to ventilate to every heat fin of the sets of heat fins 73, the hot air produced by the heat fins is circulated back from the heat fins through the air gaps of the heat fins to the thermal substrate 71. Therefore, the efficiency of heat dissipation is drastically decreased. Thus, the present invention provides an improved design of the heat dissipating device that can overcome those defaults and problems of the conventional heat dissipating device.

SUMMARY OF THE INVENTION

It is an object of the present invention to provide an improved design of the heat dissipating device, wherein the elevated heat dissipating device of the present invention comprises a thermal substrate connecting to a heat source. A heat conductive pipe comprises a connecting part connected to a top portion of the thermal substrate, and a bending part which is bended and extended upward away from the thermal substrate. The bending part of the heat conductive pipe is parallel to the thermal substrate, wherein its shadow is projected onto the thermal substrate. A plurality of sets of heat fins is connected to end portions of the bending parts of the heat conductive pipe. A fan is located on a top part of the plurality of sets of heat fins. A plurality of air passages are formed in between those heat fins and are directed toward to the thermal substrate so that cool air ventilates from the fan through the air passages of the heat fins to the thermal substrate. The characteristics of the improved elevated heat dissipating device allow the cool air from outside to free-flow through every heat fin, every air passage of the heat fins and the air space between the sets of the heat fins and the thermal substrate without any interference. A strong air circulation within the device is created in the present invention so that the heat energy generated by the heat source is immediately transmitted and dissipated out from the device to the outside. Therefore, the efficiency of the heat dissipation is drastically increased.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
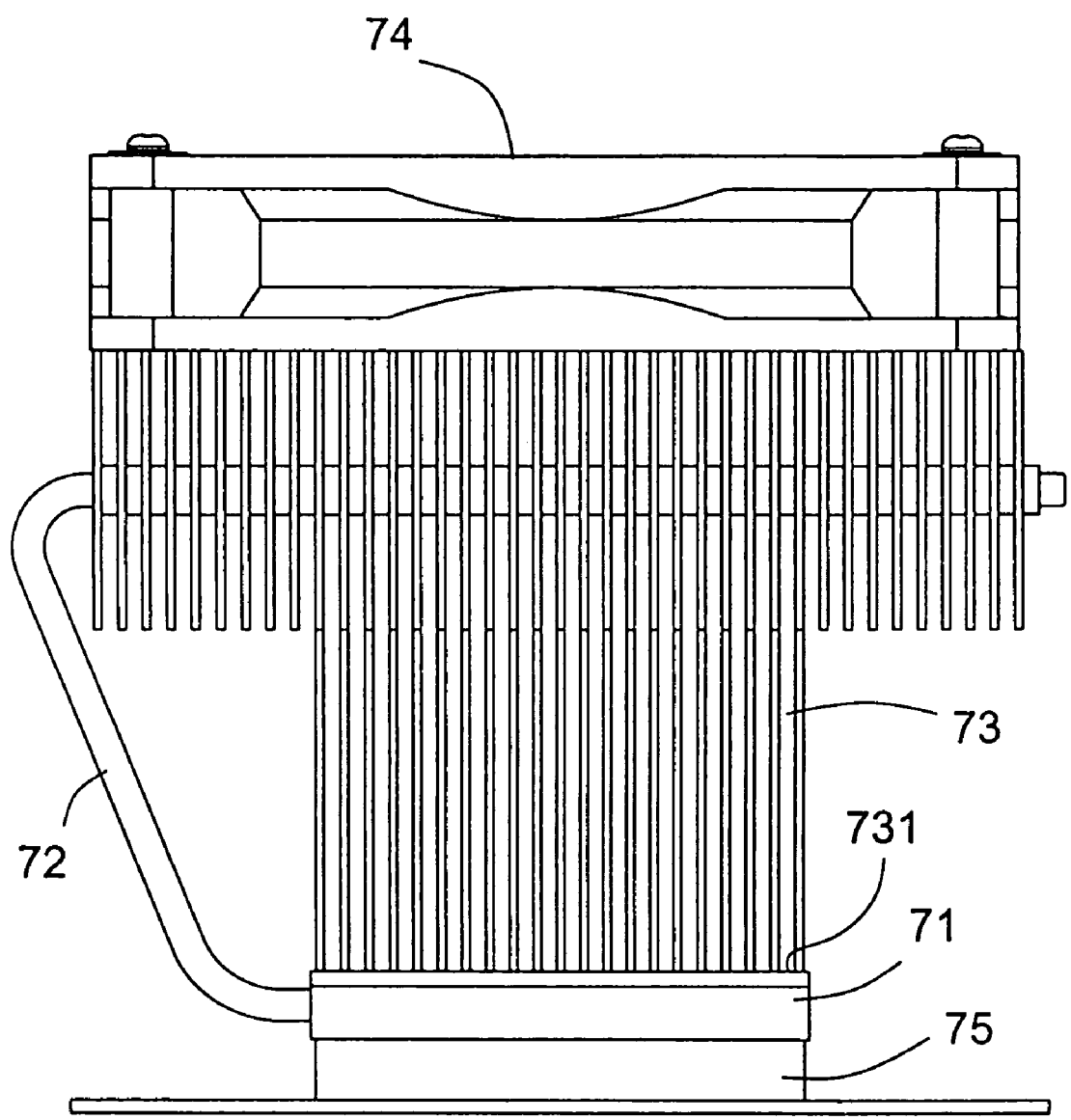
FIG. 1 shows a side view of a conventional heat dissipating device.
Figure 2:
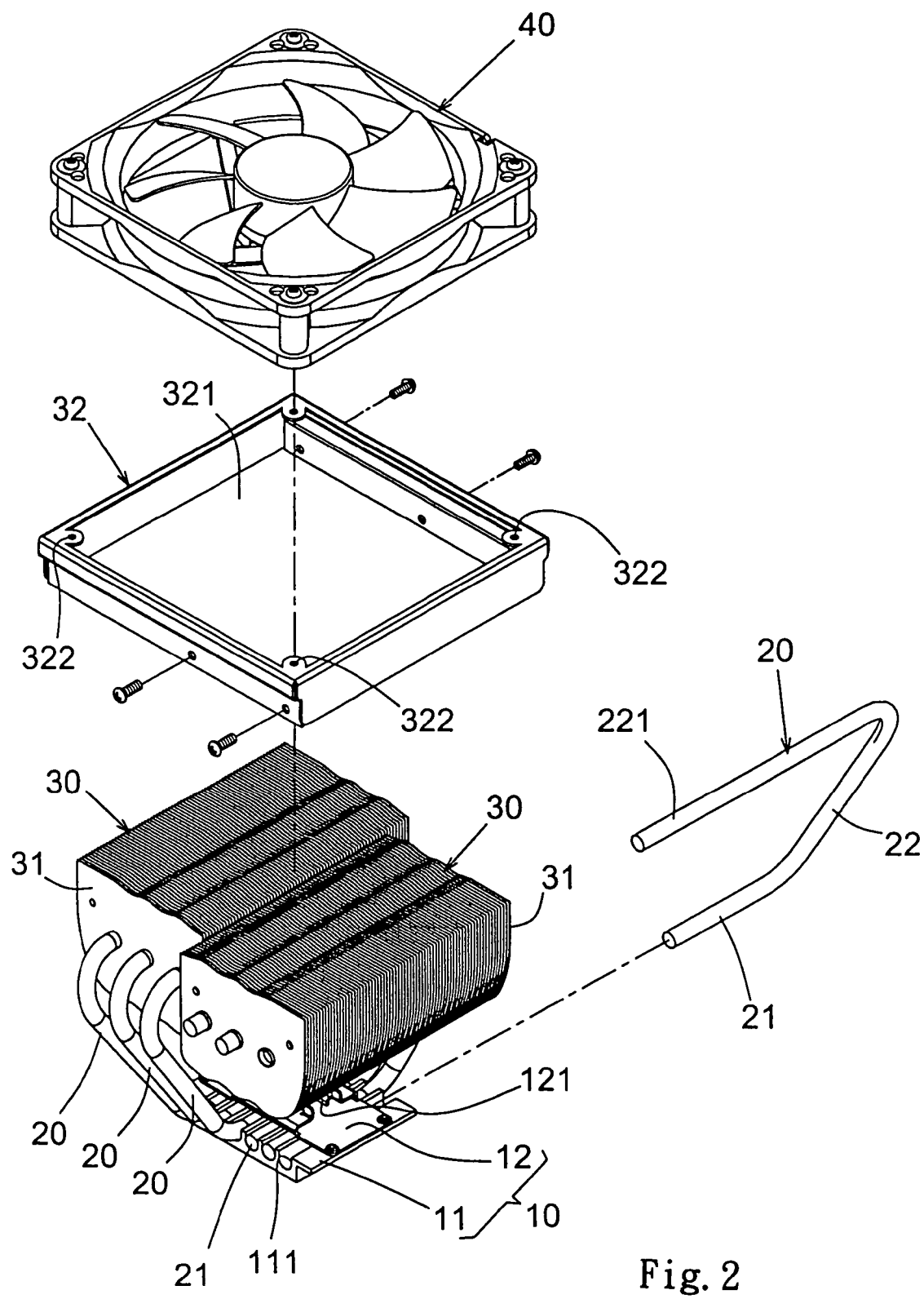
FIG. 2 is an 3-D assembly view of an elevated heat dissipating device in accordance with the preferred example of the present invention.
Figure 3:
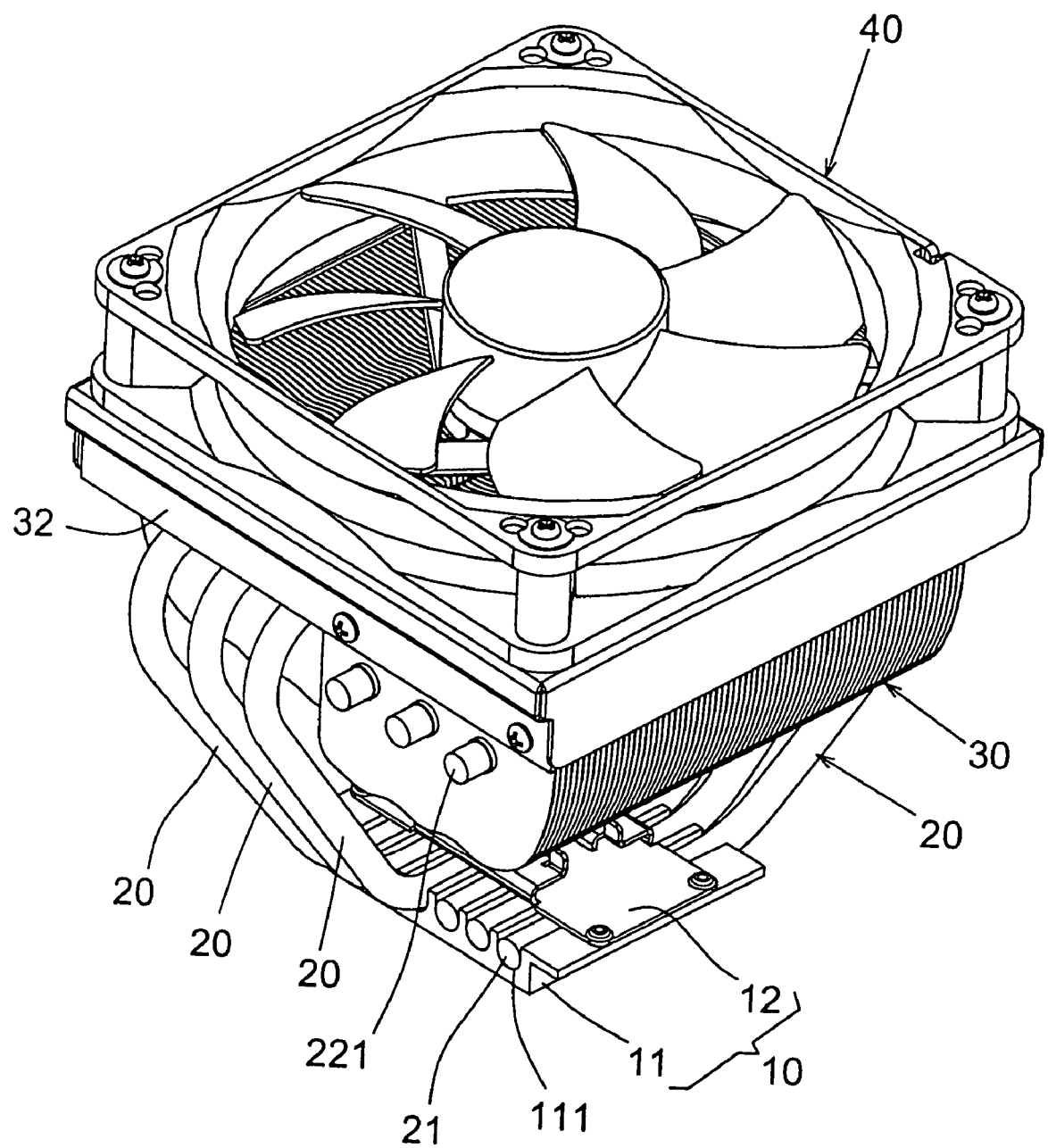
FIG. 3 is another 3-D assembled view of the elevated heat dissipating device in accordance with the preferred example of the present invention.
Figure 4:
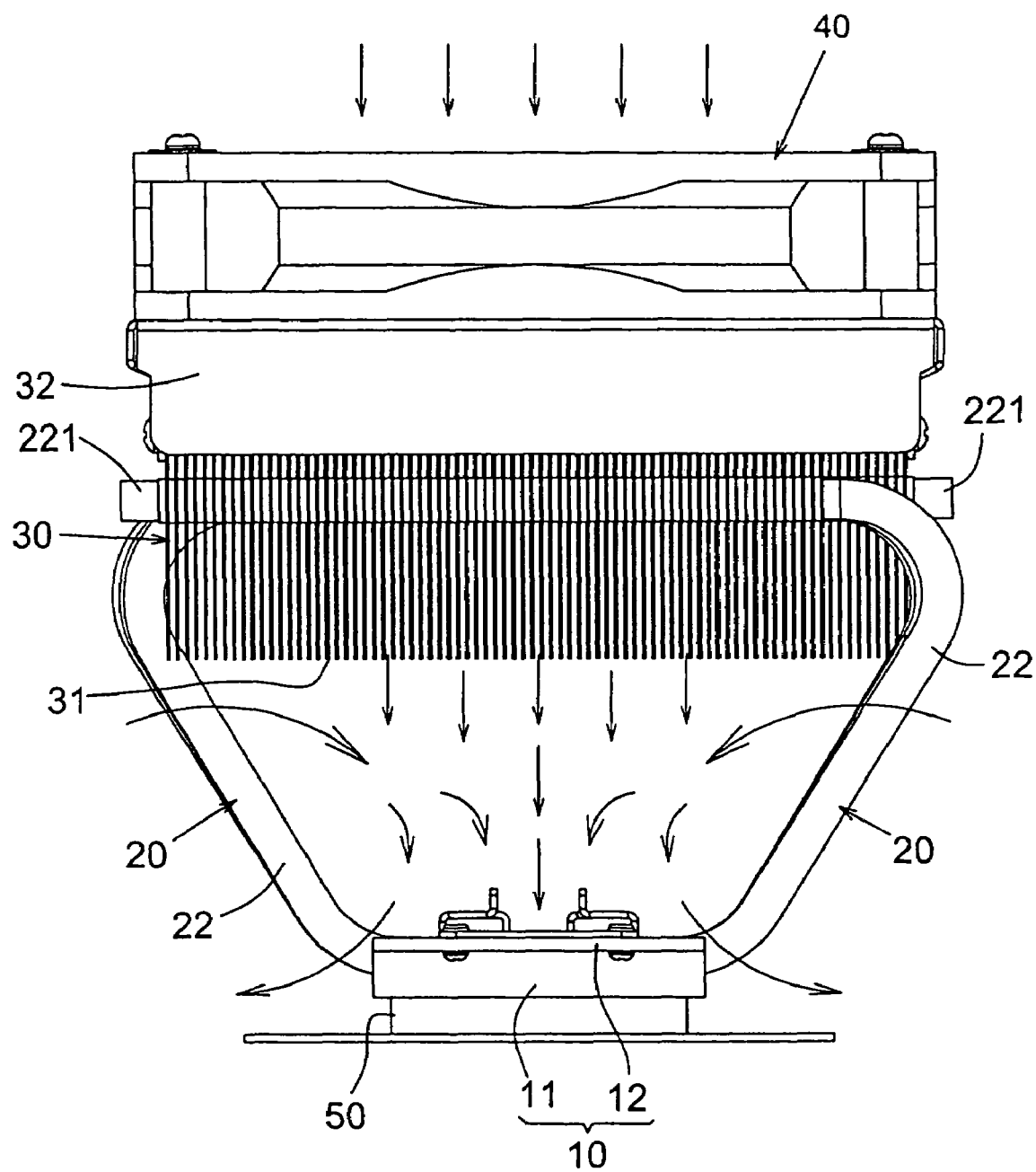
FIG. 4 is a side view of the elevated heat dissipating device of the present invention.

Refer to FIGS. 2, 3 and 4, an elevated heat dissipating device of the present invention comprises a thermal substrate 10, at least one heat conductive pipe 20, a plurality of sets of heat fins 30 and a fan 40. The sets of heat fins 30 are supported and elevated by the heat conductive pipe 20 so that the sets of heat fins 30 are located above the thermal substrate 10 and an air space is formed in between the thermal substrate 10 and the sets heat fins 30. Therefore, cool air ventilates from outside through the air space into the elevated heat dissipating device to increase the efficiency of heat dissipation.

The thermal substrate 10 of the elevated heat dissipating device of the present invention further comprises a base 11 that is tightly fixed onto a heat source 50. The main objective of the base is similar to a central processor of a motherboard because the base controls the main functions of the elevated heat dissipating device. A supporting part 111 is formed on the base 11 to support a connecting portion 21 of the heat conductive pipe 20. A fix pressing board 12 comprises a bottom part and a top part, wherein the bottom part of the fix pressing board 12 is located on the connecting portion 21 of the heat conductive pipe 20 and is locked onto the base 11 so that the fix pressing board 12, the connecting portion 21 of the heat conductive pipe 20 and the base 11 are tightly fixed together.

With reference to the above-mentioned thermal substrate 10, a trench 121 is formed at a top portion of the fix pressing board 12 in order to stabilize a hook device which is not shown in the drawings. The base 11 of the thermal substrate 10 is located close to the heat source 50 so that the heat generated from the heat source 50 can be transmitted though the conduction and radiation to the thermal substrate 10. The heat is consequently transmitted along the heat conductive pipe 20 to the sets of heat fins 30. The above-mentioned hook device is utilized to connect the thermal substrate 10 and the heat source 50. However, the connection between the thermal substrate 10 and the heat source 50 is not limited to the utilization of the hook device and other methods or devices can be utilized.

The heat conductive pipe 20 as shown in FIGS. 2, 3 and 4, comprises a connecting part 21, which is tightly fixed onto the thermal substrate 10, and a bending part 22 of the heat conductive pipe 20, which is formed with an angle and is extended outward away from the thermal substrate 10. The end portion 221 of the bending part 22 is formed horizontally in respect to the thermal substrate 10. In other words, the end portion 221 of the bending part 22 is parallel to the thermal substrate 10 so that its shadow is projected onto the thermal substrate 10 from above.

The sets of the heat fins 30 of the elevated heat dissipating device of the present invention are made of a plurality of heat fins 31 assembled together, wherein the end portion 221 of the bending part 22 is connected to the sets of the heat fins 30 and is parallel to the thermal substrate 10 so that its shadow is projected onto the thermal substrate 10 from above. An air passage is formed in between the heat fins 31 and is directed toward the thermal substrate 10 due to its assembled design. When a fan 40 is switched on, the cool air can flow through the plurality of air passages located between the heat fins 31 directly towards the thermal substrate 10 to dissipate the heat to the outside. The air space formed in between the sets of the heat fins 30 and the thermal substrate 10 provide a large air space to allow the cool air to ventilate through the device and dissipate the heat away from the device as soon as possible so that the efficiency of the heat dissipation is increased.

The elevated heat dissipating device of the present invention further comprises a fan frame 32 that is locked tightly on a top part of the sets of the heat fins 30. A ventilating hole 321 is formed on a top portion of the fan frame 32. A plurality of fixing holes 322 are formed on the top portion of the fan frame 32 and are utilized to lock the fan 40 onto the fan frame 32 so that the fan 40 can be located above the sets of heat fins 30.

The elevated heat dissipating device of the present invention as shown in FIGS. 2, 3 and 4, a plurality of connecting parts 21 of the a plurality of the heat conductive pipe 20 are tightly fixed onto the thermal substrate 10. The heat conductive pipes 20 are formed into L-shaped so that they can be utilized to connect to both sides of the thermal substrate 10 by extending its lengths outward as shown in FIG. 3. The end portion 221 of every heat conductive pipe 20 is parallel to the thermal substrate 10 so that the shadow of the sets of the heat fins 30 is projected onto the heat substrate 10. Each set of the heat fins 30 is supported and elevated by the heat conductive pipe 20 above the thermal substrate 10. The ventilated passage located in between the heat fins 31 is designed to allow cool air ventilate through the heat fins 31 to the thermal substrate 10 so that the efficiency of the heat dissipation is increased. The present invention provides an improved design of an elevated heat dissipating device that does not limit to the numbers of the sets of the heat fins 30 and the heat conductive pipes 20 utilized in the device.

The main characteristics of the elevated heat dissipating device of the present invention is that the plurality of sets of the heat fins 30 are elevated above the thermal substrate 10 and supported by the plurality of the heat conductive pipes 20 so that the air space is formed in between the thermal substrate 10 and the sets of the heat fins 30 to allow an efficient ventilation. The location of the sets of the heat fins 30 advances the heat dissipation between the heat fins 31 and the thermal substrate 10.

When the heat source 50 generates heat, the heat energy will be transmitted upwards from the heat source 50 to the thermal substrate 10. The heat energy of the thermal substrate 10 is then mixed with the cool air flowing in between the air space of the sets of the heat fins 30 and the thermal substrate 10 to create hot air. The transmission of the hot air from the heat source through the heat conductive pipe 20 to the sets of the heat fins 30 can be done by heat radiation, or it can be done through the fan 40 located above the sets of the heat fins 30 to circulate the hot air inside the device as shown in FIG. 4. (the arrows indicate the air flow directions).

As a matter of fact, the present invention provides an improved design of elevated heat dissipating device that the cool air from outside will free-flow through every heat fin 30, every air passage of the heat fins 31 and the air space between the sets of the heat fins 30 and the thermal substrate 10 of the elevated heat dissipating device without any interference. As shown in FIG. 4, the air-flow directions indicated by the arrows, indicating a strong air circulation within the device in such that the heat energy generated by the heat source 50 is immediately transmitted and dissipated out from the device to the outside so that the efficiency of the heat dissipation is drastically increased.

Other embodiments of the invention will appear to those skilled in the art from consideration of the specification and practice of the invention disclosed herein. It is intended that the specification and examples to be considered as exemplary only, with as true scope and spirit of the invention being indicated by the following claims.

I claim:

1. An elevated heat dissipating device comprising:
   a thermal substrate, connecting onto a heat source;
   at least one heat conductive pipe, connecting to the thermal substrate, wherein the heat conductive pipe further comprises a connecting part connected to a top portion of the thermal substrate, and a bending part which is bended and extended upward away from the thermal substrate;
   a plurality of sets of heat fins, connecting to the heat conductive pipe,
   a fan located at the top part of the plurality of sets of heat fins, wherein a plurality of air passages are formed in between those heat fins and are directed toward the thermal substrate so that cool air ventilates from the fan through the air passages of the heat fins to the thermal substrate, wherein the sets heat fins are supported and elevated by the heat conductive pipe resulting in an air space formed between the thermal substrate and the sets of heat fins; and
   a fan frame positioning the fan so that the fan is located fixedly above the sets of heat fins,
   wherein a ventilating hole is formed on a top part of the fan frame and a plurality of fixing holes are formed on the top part of the fan frame in order to screw the fan tightly to the fan frame so that the fan is stably positioned above the set of heat fins.

2. The device of claim 1, wherein a plurality of connecting parts of the plurality of the heat conductive pipes are connected to the top portion of the thermal substrate, wherein every heat conductive pipe is formed into L-shaped and is extended upwards from both sides of the thermal substrate, and a plurality of bending parts of the heat conductive pipes are located directly above the thermal substrate, and are also parallel to the thermal substrate.

* * * * *